United States Patent [19]

Meade et al.

[11] Patent Number: 5,526,449
[45] Date of Patent: Jun. 11, 1996

[54] OPTOELECTRONIC INTEGRATED CIRCUITS AND METHOD OF FABRICATING AND REDUCING LOSSES USING SAME

[75] Inventors: Robert Meade, Somerville; John Joannopoulos, Belmont, both of Mass.; Oscar L. Alerhand, Marlboro, N.J.

[73] Assignee: Massachusetts Institute of Technology, Cambridge, Mass.

[21] Appl. No.: 280,105

[22] Filed: Jul. 14, 1994

Related U.S. Application Data

[63] Continuation of Ser. No. 2,430, Jan. 8, 1993, abandoned.
[51] Int. Cl.$^6$ .............................. G02B 6/12; H01L 21/70
[52] U.S. Cl. .................. 385/14; 385/15; 385/16; 385/32; 385/129; 385/131; 385/132; 385/1; 385/2; 385/43; 437/16; 437/20; 437/51
[58] Field of Search .......................... 385/14, 129, 130, 385/131, 132, 1, 2, 24, 32, 43; 437/15, 16, 20, 21, 51

[56] References Cited

U.S. PATENT DOCUMENTS

| | | | |
|---|---|---|---|
| 5,054,872 | 10/1991 | Fan et al. | 385/130 |
| 5,133,036 | 7/1992 | Törnqvist | 385/130 |
| 5,187,461 | 2/1993 | Brommer et al. | 333/219.1 |
| 5,195,071 | 3/1993 | Funato et al. | 369/44.37 |
| 5,335,240 | 8/1994 | Ho et al. | 372/39 |
| 5,365,541 | 11/1994 | Bullock | 372/99 |
| 5,406,573 | 4/1995 | Ozbay et al. | 372/43 |

FOREIGN PATENT DOCUMENTS

| | | | |
|---|---|---|---|
| 0349038 | 1/1990 | European Pat. Off. | 372/43 X |
| WO92/11547 | 7/1992 | WIPO | 385/14 X |
| WO92/15124 | 9/1992 | WIPO | 385/14 X |
| WO92/16031 | 9/1992 | WIPO | 385/14 X |

OTHER PUBLICATIONS

Robert D. Meade et al., "Existence of a photonic band gap in two dimensions," *Applied Phys. Lett.* 61(4): 495 . 497, Jul. 27, 1992.

Eli Yablonovitch, "Inhibited Spontaneous Emission in Solid–State Physics and Electronics," *Physical Review Letters* 58(20): 2050–2062, May 18, 1987.

W. M. Robertson et al., "Measurement of Photonic Band Structure in a Two–Dimensional Periodic Dielectric Array," *Physical Review Letters* 68(13): 2030–2026, Mar. 30, 1992.

K. M. Ho et al., "Existence of a Photonic Gap in Periodic Dielectric Structures," 65(25): 3152–3155, Dec. 17, 1990.

E. Yablonovitch et al., "Photonic Band Structure: The Face–Centered–Cubic Case Employing Nonspherical Atoms," 67(17): 2295–2298, Oct. 21, 1991.

Lenz, G., et al., "Bragg Reflection Waveguide Composite Structures," *IEEE Journal of Quantum Electronics*, 26(3):519–531, (Mar. 1990).

Yeh, P., et al., "Bragg Reflection Waveguides," *Optics Communications*, 19(3):427–430, (Dec. 1976).

Himeno, P., et al., "Loss Measurement and Analysis of High–Silica Reflection Bending Optical Waveguides," *Journal of Lightwave Technology*, 6(1):41–46, (Jan. 1988).

(List continued on next page.)

*Primary Examiner*—Brian Healy
*Attorney, Agent, or Firm*—Hamilton, Brook, Smith & Reynolds

[57] ABSTRACT

An optical circuit and a method for substantially eliminating radiation losses associated with optical integrated circuits and, in particular, bends in optical waveguides, is disclosed. The circuit and waveguide are fabricated on a substrate having a periodic dielectric structure. The periodic dielectric structure exhibits a range of frequencies of electromagnetic radiation which cannot propagate into the structure. The range of frequencies is known as a photonic band gap or frequency band gap. Radiation at a frequency within the frequency band gap of the structure is confined within the circuit and waveguide by the periodic dielectric structure surrounding the circuit and waveguide. Radiation losses are substantially eliminated.

62 Claims, 10 Drawing Sheets

OTHER PUBLICATIONS

Mohammad, M., et al., "Low–Loss Ti: LiNbO$_3$—Waveguide Bends Prepared by MgO Indiffusion," *Journal of Lightwave Technology*, 8(11):1670–1674, (Nov. 1990).

Takeuchi, H., et al., "Very low loss GaAs/AlGaAs miniature bending waveguide with curvature radii less than 1 mm," *Applied Physics Letters*, 54(2):87–89, (Jan. 1989).

Russell, P., "Photonic band gaps," *Physics World*, pp. 37–42, (Aug. 1992).

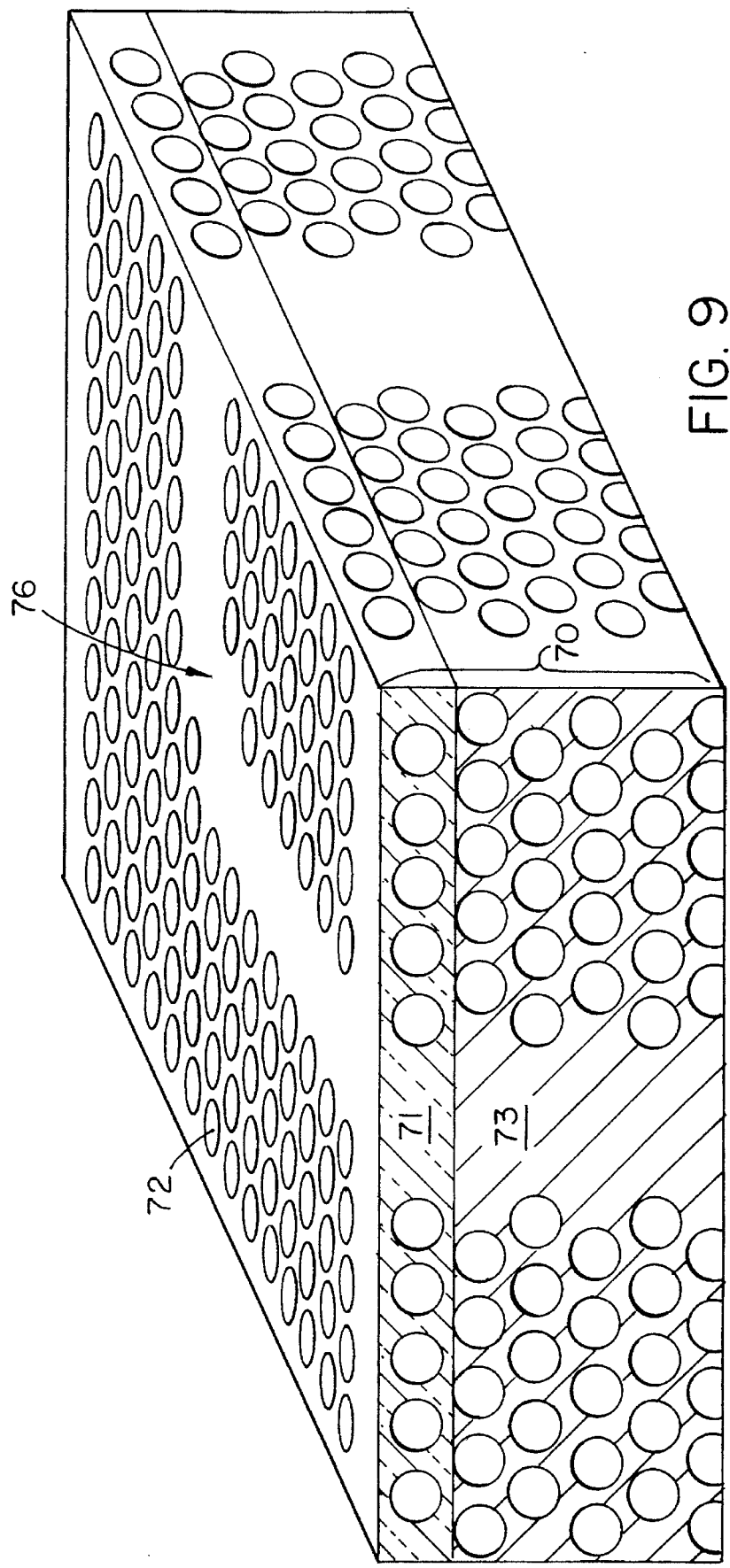

OPTOELECTRONIC INTEGRATED CIRCUITS AND METHOD OF FABRICATING AND REDUCING LOSSES USING SAME

RELATED APPLICATION

This application is a continuation of application Ser. No. 08/002,430 filed on Jan. 8, 1993, now abandoned, which is incorporated herein by reference in its entirety.

BACKGROUND OF THE INVENTION

Optical integrated circuits and optoelectronic integrated circuits are usually fabricated on the top surface of a uniform substrate. These circuits can experience optical losses as light propagates away from the circuits and into the uniform substrate. It is desirable to produce optical and optoelectronic integrated circuits as compact as possible on a substrate to produce small lightweight circuits. However, losses experienced by the interconnects between circuits tend to inhibit the reduction of the overall system size.

Interconnects in optical integrated circuits and optoelectronic integrated circuits are achieved by using waveguides to transport light from one optical device to another. Waveguides are also the basis of numerous optical devices including optical couplers, switches, modulators, power dividers and combiners.

Light propagating through an optical waveguide is contained within the waveguide by total internal reflection. The medium outside the waveguide has a lower index of refraction than does the interior of the waveguide. The boundary between the interior and exterior of the waveguide is characterized by a critical angle determined by the ratio of the refractive indices or index contrast of the two media. The critical angle of the boundary can be defined as the angle below which light inside the waveguide must strike the boundary in order to be reflected back into the waveguide rather than be transmitted through the boundary and out of the waveguide. Light inside the waveguide which strikes the boundary at an angle smaller than the critical angle cannot pass through the boundary and is reflected back into the waveguide.

Since nearly all of the light traveling through a straight optical waveguide strikes the waveguide boundary at very small angles, very little loss is suffered. However, in fabricating optical and optoelectronic integrated circuits, it is necessary to make optical waveguides with bends. Also, certain devices such as optical couplers require bends in their waveguides. Unlike straight waveguide sections, waveguide bends can produce significant losses. As the light traveling through the waveguide enters a bend, it strikes the boundary at a larger angle than it does in a straight section. If the index contrast does not provide a large enough critical angle, some of the light escapes from the waveguide, thus introducing bend loss.

Bend losses have proven to be a substantial impediment to the development of optical and optoelectronic integrated circuits. To minimize losses, bends must be made with large radii of curvature, typically on the order of 10 mm. Such large bend radii are not practical for compact optical and optoelectronic integrated circuits.

Numerous approaches have been suggested to minimize bend losses. One of these is the use of abrupt bends rather than curved bends. Abrupt bends have sharp corners joining two straight sections of waveguide. The drawback to abrupt bends is that the bend angle must be very small, on the order of 1 degree. So, this approach contributes little to making circuits more compact.

Another approach has been to grade the index of refraction of the substrate in the area of the bend to maintain internal reflection around the bend. Combinations of these two approaches have also been suggested. However, no present approach appears to be able to substantially reduce the radii of curvature of waveguide bends to facilitate the development of compact optical and optoelectronic integrated circuits.

SUMMARY OF THE INVENTION

The present invention is an optical circuit and a method which substantially eliminates radiation losses in optical integrated circuits. The circuit is formed on a surface of a substrate made of a semiconductor or other type material including dielectric and optical materials. The substrate comprises a region which is characterized by a frequency band gap. The frequency band gap is a band of frequencies at which electromagnetic radiation and, in particular, light waves cannot propagate through the region. The circuit is formed in the region having the frequency band gap such that radiation which would otherwise escape from the circuit into the substrate cannot propagate into the substrate.

The circuit of the present invention experiences reduced radiation losses at frequencies within the band gap of the substrate. In particular, losses at waveguide bends are substantially eliminated. Some of the light traveling through a waveguide bend strikes the boundary between the interior and the exterior of the waveguide at angles greater than the critical angle and would otherwise tend to escape from the waveguide into the substrate. However, in the present invention, the bend is formed in the region of the substrate with the frequency band gap. Light at a frequency within the band gap cannot propagate into the substrate. The light is confined within the optical circuit and the waveguide.

The region of the substrate with the frequency band gap has a periodic dielectric structure. A periodic dielectric structure is a structure which exhibits a periodic spatial variation in dielectric constant. As applicable to the present invention, the variation in dielectric constant may be periodic in either two-dimensional or three-dimensional space within the structure.

There are various methods of forming such structures. One of these methods involves forming a periodic pattern of holes in a uniform substrate material. Another is removing substrate material such that what remains is a periodic pattern of cylindrical or other similarly shaped rods of substrate material.

There are also various methods of forming an optical waveguide on the substrate. In one embodiment, an epilayer of material of high refractive index is formed on top of a substrate having a lower index. Next, the periodic dielectric structure is formed on opposite sites of a channel in the epilayer of uniform material. The channel is shaped as desired to serve as the waveguide. The periodic dielectric structure on either side of the channel prevents radiation into the substrate. Thus light is guided through the channel by the periodic dielectric structure. Light is confined vertically within the channel by internal reflection due to the index contrast between the waveguide in the epilayer and the air on top and between the waveguide and the substrate on the bottom. In other embodiments, a material having a higher index of refraction than the substrate may be diffused into the substrate or etched on the substrate. Alternatively, a material of higher refractive index may be deposited by sputtering, evaporation or other process onto the surface of the substrate. Another method involves forming a pair of trenches in a high-refractive-index layer deposited on the top surface of the substrate. The material between the trenches serves as the optical waveguide. The air in the trenches is the low-refractive-index exterior medium which provides lateral internal reflection due to index contrast. Periodic dielectric structure is provided on the outside of the trenches to eliminate loss where the requirements for internal reflection are not met. Vertical losses are eliminated by internal reflection due to the refractive index contrast.

The present invention provides substantial advantages over previous methods of reducing loss in optical circuits and in optical waveguide bends. Unlike previous approaches, it is the substrate itself which prevents radiation from escaping into the substrate. The present invention does not rely upon physical constraints of a waveguide such as the bend angle, as in the abrupt bend approach. In the present invention, the waveguide bend radius can be arbitrarily small because it is the substrate which is preventing loss. Also, the index grading approach relied on the index contrast between the waveguide and the substrate to maintain internal reflection. Even with index grading, a critical angle is present which constrains the radius of curvature. Because the present invention does not rely solely on index contrast and internal reflection at bends, the radius of curvature at the bend is not so constrained.

Because waveguide bend radii are reduced, optical and optoelectronic circuits can be made much more compact and light weight. These circuits can be totally integrated. Different optical devices and interconnects can be fabricated on a common substrate. High-speed electronics can be fabricated on the same chip as associated optoelectronic devices.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 2b is a schematic top view of the waveguide section of FIG. 2a.

FIG. 7b is a schematic top view of the optical circuit of FIG. 7a.

FIG. 8b is a schematic top view of the device of FIG. 8a.

FIG. 9 is a schematic perspective view of a waveguide on a substrate having a three-dimensional periodic dielectric structure in accordance with the present invention.

DETAILED DESCRIPTION OF THE INVENTION

Optical integrated circuits and optoelectronic integrated circuits can be classified as either active or passive circuits. Optical integrated circuits perform a variety of passive functions, including switching and modulating, without generating or detecting light. Optoelectronic circuits generate and detect light as well as perform certain passive functions. The present invention is applicable to both types of circuits.

It should be noted that throughout this application, the terms "optical integrated circuits", "optoelectronic circuits", "optical circuits", and other related terms will be used to describe the various types of circuits to which the invention is applicable. Unless otherwise specifically stated, the use of one of these terms in this application does not limit the applicability of the description to that type of circuit. One term is selected over another for illustration purposes only. The present invention is applicable to all of these circuits.

Optical circuits can be fabricated on a top surface of a substrate. The optical waveguides which connect the circuits can also be fabricated on the surface of the substrate. These optical waveguides consist of a channel having an index of refraction which is higher than the index of refraction of the surrounding substrate. Because of the index contrast, light is guided along the channel by total internal reflection.

Optical waveguides are used to guide optical signals among the elements in optical and optoelectronic integrated circuits and are analogous to the metallic lines used to guide electrical signals among electronic integrated circuits. They connect external optical devices such as fiber optic cables with internal optical devices such as switches, modulators, sources, and detectors. In addition, they form the basic structural elements in numerous optical devices including optical couplers, switches, modulators, power dividers, and combiners.

Figure 1A:
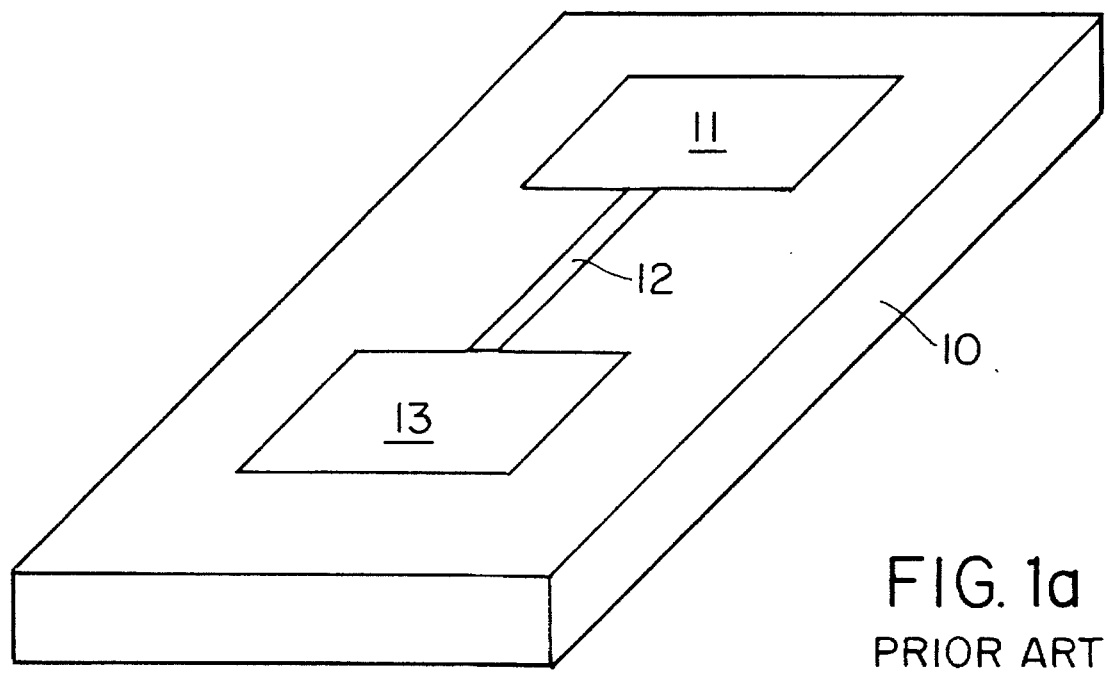
FIG. 1a is a schematic perspective view of a prior art optical circuit.

Integrated optical circuits and waveguides can be implemented by several different techniques. One prior art example is shown in FIG. 1a. A substrate 10 is made of a material such as $LiNbO_3$ having a low index of refraction. Optical circuits 11 and 13 are formed in the substrate 10 by techniques such as photolithography, diffusion, ion implantation, etching and the like. The optical waveguide 12 is made of a material having a high index of refraction which may be formed by diffusing titanium into the substrate 10.

Figure 1B:
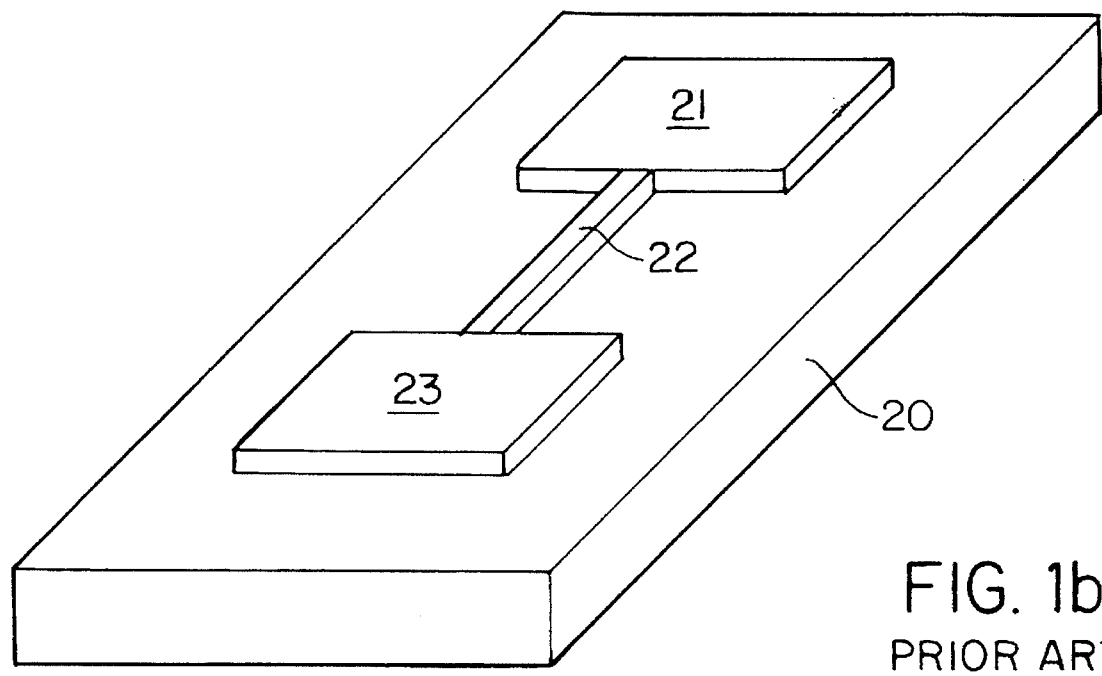
FIG. 1b is a schematic perspective view of another prior art optical circuit.

Another type of integrated optical circuit and waveguide, commonly referred to as a rib waveguide, is shown in FIG. 1b. The rib waveguide 22 connects circuits 21 and 23. In this device, the optical channel 22 of high refractive index is formed on the top surface of a low-refractive-index semiconductor substrate 20. The substrate material may be $Ga_xAl_{(1-x)}As$ or other similar material. The channel 22 may be formed of GaAs or other high-refractive-index material. The channel 22 is formed by depositing GaAs onto the surface of the substrate 20.

FIGS. 1a and 1b illustrate straight waveguide sections 12 and 22. Light propagating through the waveguides strikes the barrier between the interior and exterior of the waveguides at small angles. Consequently, the light is confined within the waveguides by total internal reflection. However, to be useful in optical integrated circuits applications, waveguides, at times, must include bends.

Figure 2A:
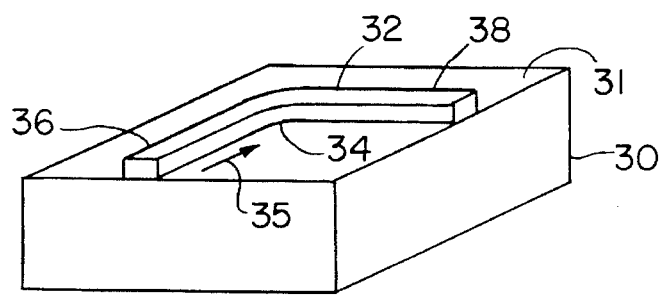
FIG. 2a is a schematic perspective view of a prior art uniform substrate with a rib waveguide section having a bend.
Figure 2B:
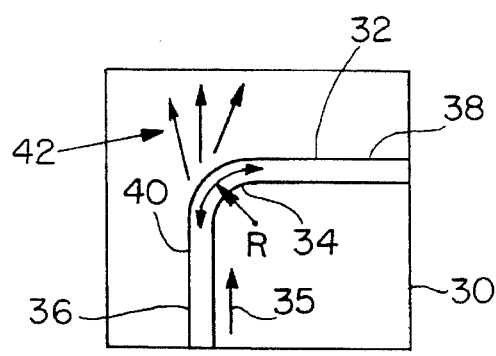

FIG. 2a schematically depicts a section of a prior art rib waveguide 32 which includes a 90° circular bend 34. The waveguide 32 is fabricated on the top surface 31 of a substrate 30 as described above in connection with FIG. 1b. FIG. 2b is a schematic top view of the waveguide section 32.

For purposes of illustration, light is assumed to propagate through the waveguide 32 in the direction indicated by arrows 35. It will be understood that the actual direction of propagation is immaterial to the invention. The light travels through straight section 36 of the waveguide 32 and then enters bend 34. The light which remains within the waveguide after passing through the bend travels through straight section 38.

As light leaves the straight section 36 and enters the bend 34, it strikes the barrier 40 between the interior and the exterior of the waveguide at larger angles. Some of these angles exceed the critical angle required for reflection determined by the index contrast at the barrier 40. The light which exceeds the critical angle passes through the barrier 40, exits the waveguide 32, and propagates into the air around the waveguide and the substrate 30. This lost light, represented by arrows 42 in FIG. 2b, is the optical loss associated with the bend, or simply the bend loss.

As shown in FIG. 2b, the bend 34 has a radius of curvature R. As R decreases, the angle at which light strikes the barrier 40 increases. More light escapes from the waveguide 32 causing increased bend loss. Experiments have shown that bend losses increase exponentially with decreasing bend radius of curvature That is $L \sim ae^{-R/b}$, where L is the loss, R is the radius of curvature, and a and b are constants.

Depending upon the application in which the waveguide is used, there is a certain maximum bend loss which can be tolerated. This maximum tolerable bend loss corresponds to a minimum allowable bend radius. Thus, bend loss imposes a restraint on the ability to reduce the size of the waveguide bend, and, consequently, on the ability to fabricate compact optical integrated circuits.

Figure 3:
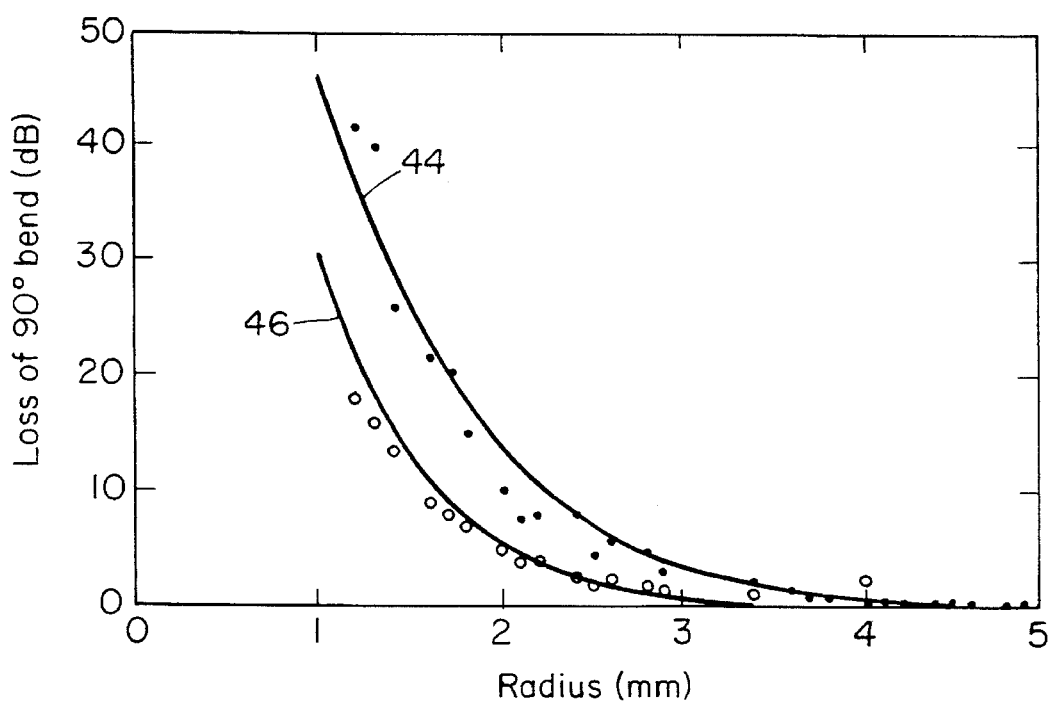
FIG. 3 is a graph of the loss associated with a 90° circular waveguide bend versus the radius of curvature of the bend for two propagation modes.

FIG. 3 is a graph of experimental data which depicts a relationship between the radius of curvature of a 90° circular waveguide bend and the loss associated with that bend. Bend loss in decibels (dB) is plotted as a function of radius of curvature in millimeters (mm) for two modes of propagation. Curve 44 is a quasi-transverse-electric mode, and curve 46 is a quasi-transverse-magnetic mode. The graph illustrates the exponential relationship between bend radius of curvature and bend loss.

To eliminate the loss associated with optical and optoelectronic integrated circuits as well as with waveguide bends, the present invention prevents light from propagating into the circuit substrate. Because the light cannot propagate into the substrate, it is confined within circuit and the waveguide.

In the preferred embodiment of the present invention, the substrate comprises a region which has a periodic dielectric structure. A periodic dielectric structure is a structure which exhibits a periodic spatial variation in dielectric constant. In one embodiment, the dielectric constant is periodic in two-dimensional space within the structure. In another embodiment, the structure exhibits three-dimensional spatial periodicity.

The periodic dielectric structure is characterized by a frequency or photonic band gap, or simply a band gap. The band gap of a periodic dielectric structure is a band of frequencies of electromagnetic radiation which cannot propagate through the structure in the plane in which the structure exhibits periodic variation in dielectric constant.

Figure 4:
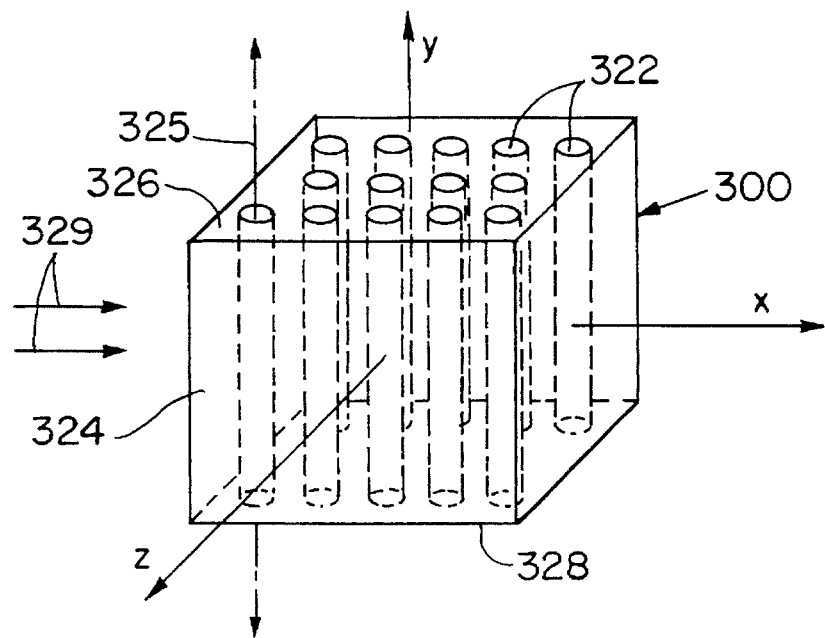
FIG. 4 is a schematic perspective view of a periodic dielectric structure having two-dimensional periodicity.

FIG. 4 is a schematic perspective view of a periodic dielectric structure 300 illustrating two-dimensional spatial periodicity. Specifically, the structure 300 is periodic in the x and z dimensions. Therefore, electromagnetic radiation having a frequency within the band gap of the structure cannot propagate in a plane parallel with the x-z plane, including the plane of the top surface 326 of the structure.

The structure 300 includes a plurality of elongated elements 322 extending orthogonal to the substrate top surface 326 and bottom surface 328. The elements 322 are preferably cylindrically shaped and extend in a two-dimensional periodic arrangement relative to the x-z plane or any plane parallel thereto. Although cylindrical elements are described hereinafter, quasi-cylindrical elements or other shaped elongated elements may be employed. They may be formed of a non-conductive low-dielectric material disposed within a non-conductive high-dielectric substrate material 324. The elements 322 may simply be bores, voids, or channels which may be filled with low-dielectric fluids or solids such as air and/or other liquid or solid material.

In an alternative embodiment, the elements may be formed of non-conductive high-dielectric material and may be disposed in the periodic arrangement in a non-conductive low dielectric material. An example of this configuration is a high-dielectric substrate with material etched away to leave only the periodic arrangement of cylindrical rods of the high-dielectric material with air in the spaces between the rods. The space may also be filled with some other low-dielectric fluid or solid.

A longitudinal axis 325 extends through the center of each element 322 in the vertical or y-direction. The elements 322 are arranged periodically in two dimensions in the x-z plane which is generally orthogonal to the longitudinal axes 325 extending through the elements 322.

The structure 300 can be positioned to filter incoming electromagnetic energy 329 polarized in any direction that is propagating in the x-z plane. The structure 300 reflects substantially all of the incident electromagnetic energy 329 having a frequency within the range of the photonic or frequency band gap. More specifically, electromagnetic energy within the frequency range of the band gap is substantially prevented from propagating through the structure 300. Thus, the structure 300 operates as a band stop filter. The structure maintains a substantially constant band gap frequency range for radiation propagating along any incident angle in the x-z plane.

Figure 5A:
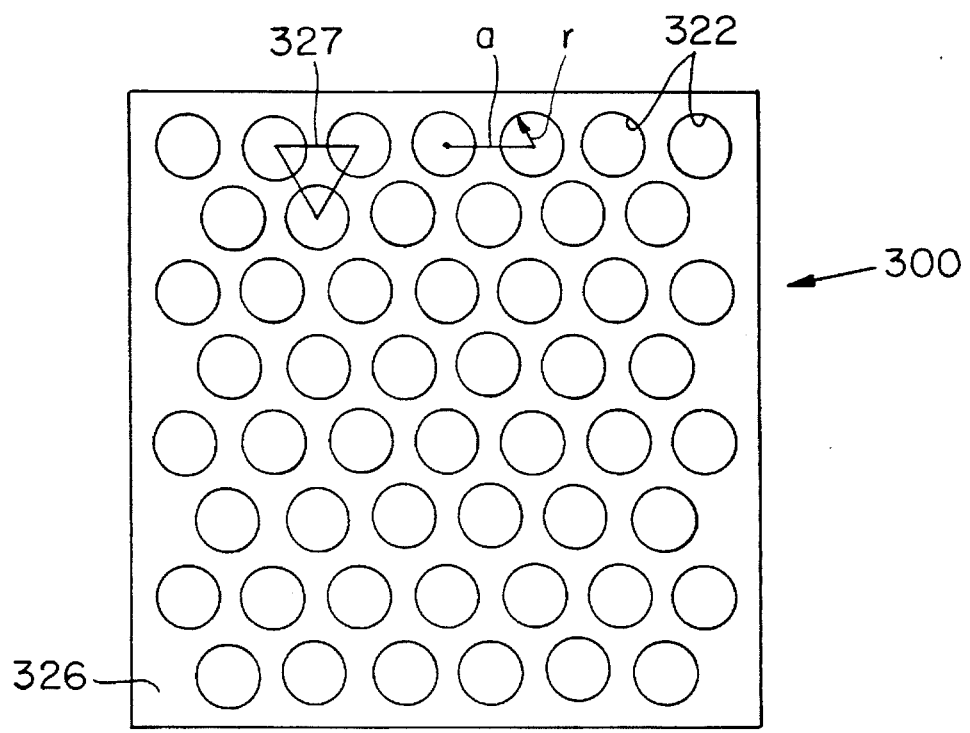
FIG. 5a is a schematic top view of the periodic dielectric structure of FIG. 4 showing a triangular lattice pattern.
Figure 5B:
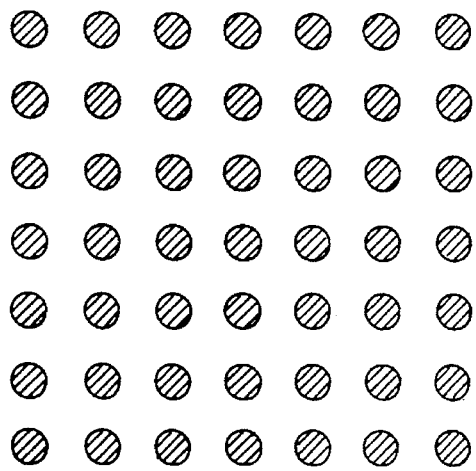
FIG. 5b is a schematic top view of a periodic dielectric structure showing a square lattice pattern.
Figure 5C:
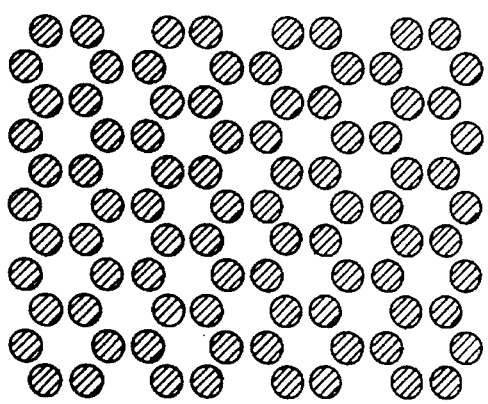
FIG. 5c is a schematic top view of a periodic dielectric structure showing a hexagonal lattice pattern.

FIG. 5a is a top view of the structure 300 of FIG. 4. In this embodiment, the cylindrical elements 322 are periodically arranged to provide a triangular lattice. The lines 327 illustrate the triangular lattice arrangement of the cylindrical elements along the top surface 326 of the substrate material 324. Other possible lattice structures are shown in FIGS. 5b and 5c. FIG. 5b shows a square lattice structure, and FIG. 5c shows a honeycomb or hexagonal lattice structure.

Figure 6:
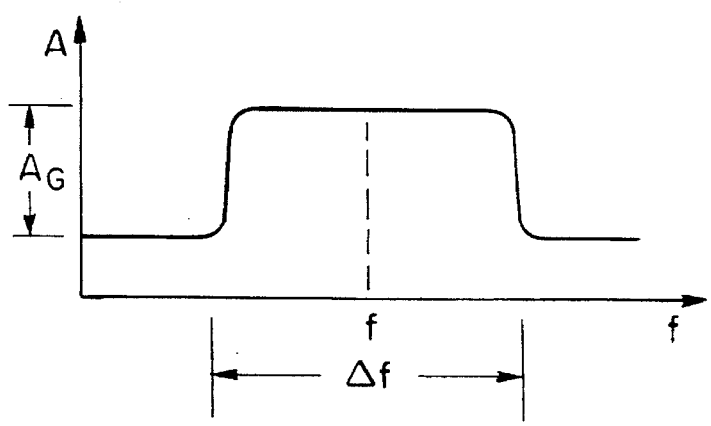
FIG. 6 is a graph of the wave attenuation in the band gap versus frequency of the wave.

A feature of the periodic dielectric structure is that the center frequency of the band gap, the bandwidth of the band gap (i.e., the stop band) and the band gap attenuation can be tailored for any frequency range in the microwave to ultra-violet bands ($10^6$ to $10^{15}$ Hz) during the fabrication of the structure. For the structure of FIGS. 4 and 5, the center frequency (f), the bandwidth ($\Delta f$) and the band gap attenuation ($A_G$) of the band gap are shown in FIG. 6. The attenuation ($A_G$) of the band gap is proportional to the number of rows of elements 322. Thus, the attenuation ($A_G$) can be increased by providing additional rows. The center frequency (f) of the bandwidth ($\Delta f$) can be computed in accordance with the following equation:

$$f=[13.8(13/\mu\epsilon)^{1/2}]/a \text{ GHz}$$

where
$\epsilon$=dielectric constant of the substrate material,
$\mu$=magnetic permeability of the substrate material, and
a=triangular lattice constant which corresponds to the distance in centimeters between centers of adjacent elements.

The location of the band gap on the frequency scale is determined by the center frequency. The bandwidth ($\Delta f$) is determined by the radius (r) of the cylindrical elements 322 and the triangular lattice constant (a).

A two-dimensional periodic dielectric structure as shown in FIGS. 4 and 5a–c may be fabricated on a portion of a homogeneous or uniform substrate by one of several methods. One method involves drilling holes in a high-dielectric uniform substrate. The holes are filled with a low-dielectric material such as air.

Another method involves the use of reactive-ion etching. The substrate is covered on one face with a mask which contains a two-dimensional array of geometric figures of the size, spacing, and periodicity required for the desired band gap. This two-dimensional array of geometric figures may be patterned by employing electron beam lithography or conventional photolithography. The geometric figures are either transparent or opaque to a reactive-ion etchant used to selectively eradicate the high dielectric substrate material. For example, if cylindrical air channels are to be formed in the substrate, the geometric figures are circles which are transparent to the etchant, and the remainder of the mask is opaque to the etchant. If square rods of high dielectric material are to be formed, the figures are squares which are opaque to the etchant, and the remainder of the mask is transparent to the etchant.

The substrate and mask are then exposed to the highly directional reactive-ion etchant. The reactive-ion plasma is directed at the mask along the perpendicular axis, and vertical channels of the desired shape are created in the substrate. The resulting array of elements forms the two-dimensional frequency or photonic band gap.

Figure 7A:
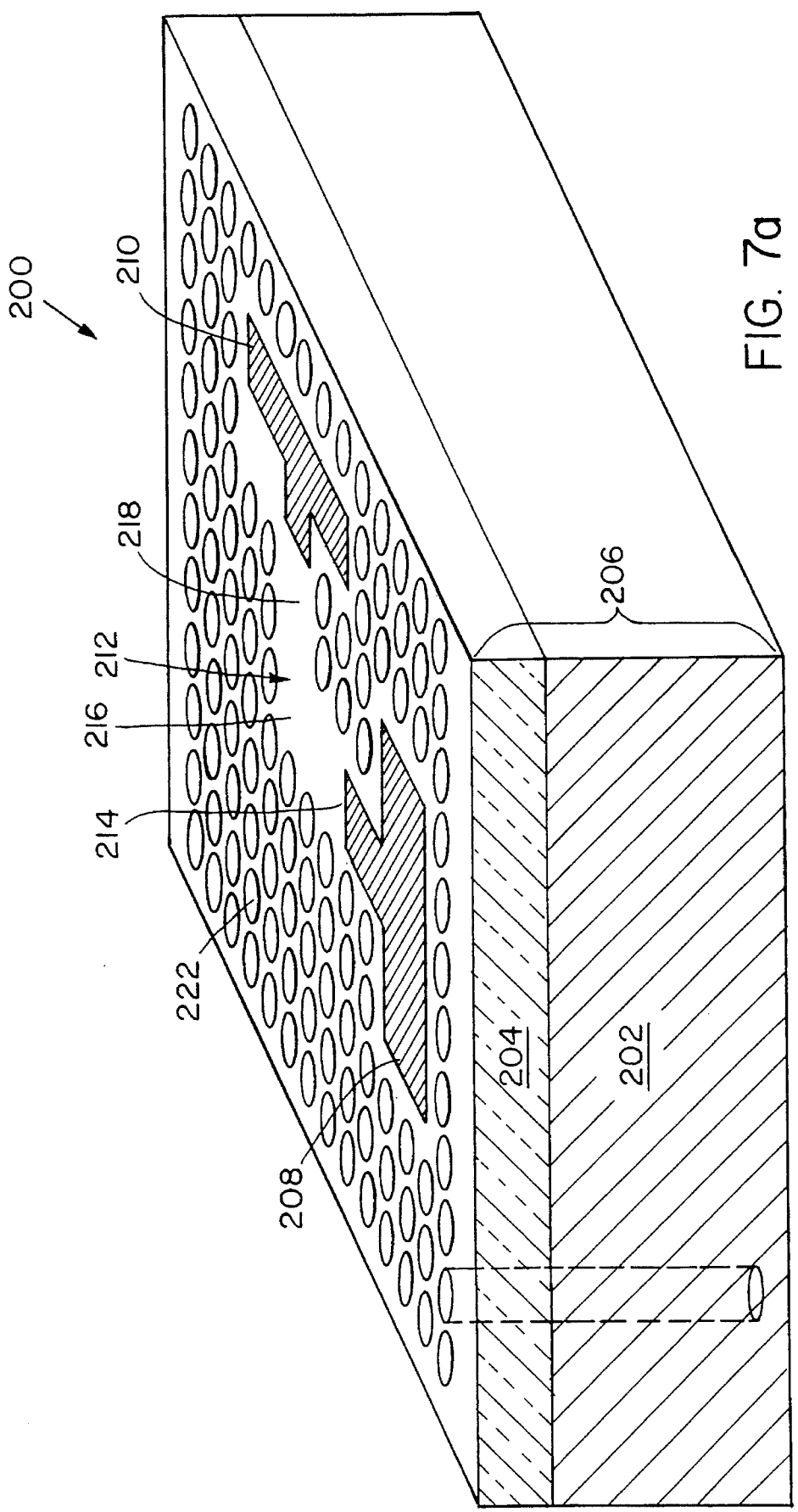
FIG. 7a is a schematic perspective view of an optical circuit in accordance with the present invention.
Figure 7B:
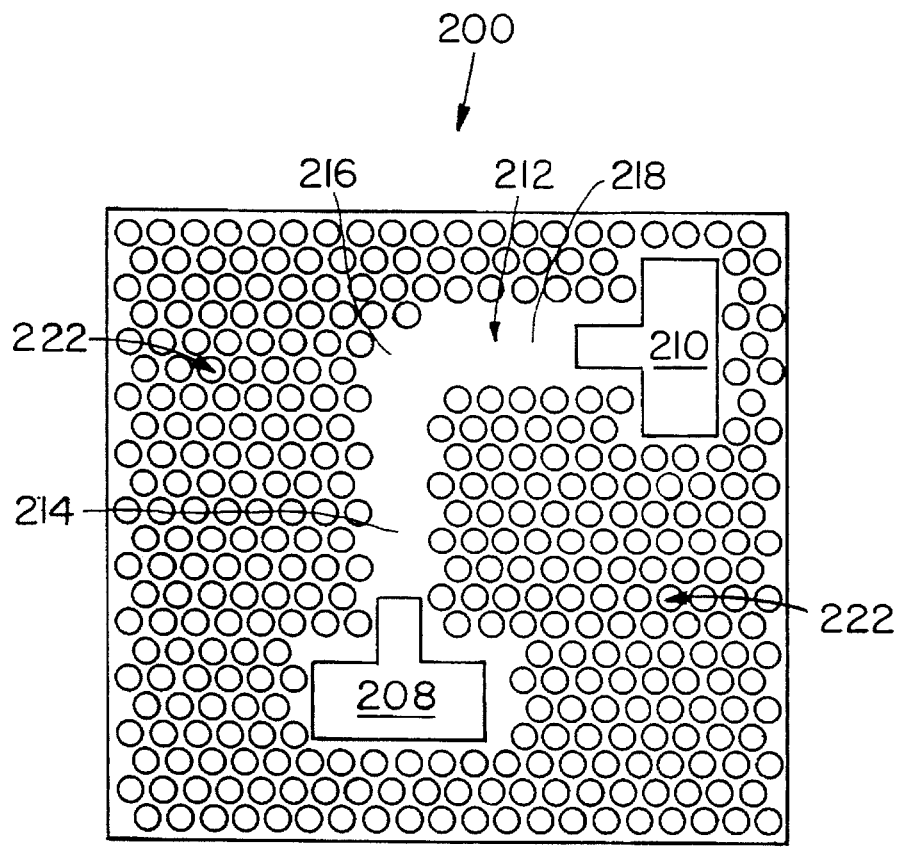

FIG. 7a is a schematic perspective view of an integrated optical circuit 200 in accordance with the present invention. FIG. 7b is a top view of the circuit 200. The circuit 200 comprises a base substrate 202 formed of a material having a low refractive index such as $Ga_xAl_{1-x}As$. An epilayer 204 made of a material having a higher refractive index than the base substrate 202 such as GaAs is formed on the top surface of the base substrate 202. The combination of the base substrate 202 and the epilayer 204 forms the substrate 206 for the optical circuit 200.

The components of the optical circuit 200 include two optical devices 208 and 210. These devices may be a laser and a detector or other similar devices. It will be understood that the invention is applicable to other such devices. Also, two devices are selected for ease of description only. Typical circuits will have more devices.

The devices 208 and 210 are connected by a waveguide 212. The waveguide 212 includes a straight section 214, a bend 216 and a second straight section 218. For illustration purposes, light is assumed to leave device 208 and propagate through the waveguide 212 toward device 210. The light passes through straight section 214, bend 216 and straight section 218 and enters device 210.

The optical devices 208 and 210 are surrounded by periodic dielectric structure 222. The periodic dielectric structure 222 prevents emissions from the devices 208 and 210 at a frequency within the band gap of the structure 222 from propagating into the substrate 206. Thus, the devices 208 and 210 are isolated from each other, the waveguide 212, and any other devices on the substrate 206.

The periodic dielectric structure 222 also serves to define the lateral extents of the waveguide 212 on the epilayer 204. The periodic dielectric structure 222 prevents light at a frequency within the band gap of the structure 222 from propagating in the plane of the epilayer 204. Thus, the light is confined laterally within the waveguide 212. Light is prevented from propagating out of the waveguide 212 in the vertical directions by internal reflection. Light will not propagate up out of the waveguide into space because of the refractive index contrast between the interior of the waveguide and the air above it. Light will not propagate down into the base substrate 202 because of the index contrast between the epilayer 204 and the base substrate 202. Because the light cannot propagate outside the waveguide 212, it is confined inside. The light entering the waveguide 212 from the device 208 travels through the straight section 214 into bend 216. It is guided around the bend 216 by the periodic dielectric structure 222 and through straight section 218 into device 210.

The circuit 200 of FIGS. 7a and 7b is made by first forming the uniform high-refractive-index epilayer 204 on top of a uniform low-refractive index base substrate 202 to form substrate 206. This is done by diffusion or similar fabrication technique. Next, the devices 208 and 210 are formed on the epilayer 204. Finally, the periodic dielectric structure 222 is formed in the substrate 206 by one of the methods previously described.

The periodic dielectric structure 222 is designed to create a frequency band gap for the substrate 206 which includes the frequency of the radiation which will be carried by the waveguide 212. To create the structure 222, the periodic pattern of holes is formed in the substrate 206. The pattern of holes is made to surround devices 208 and 210 and to define the waveguide 212 connecting the devices. The holes are made by either drilling or by the reaction ion etching process previously described.

Figure 8B:
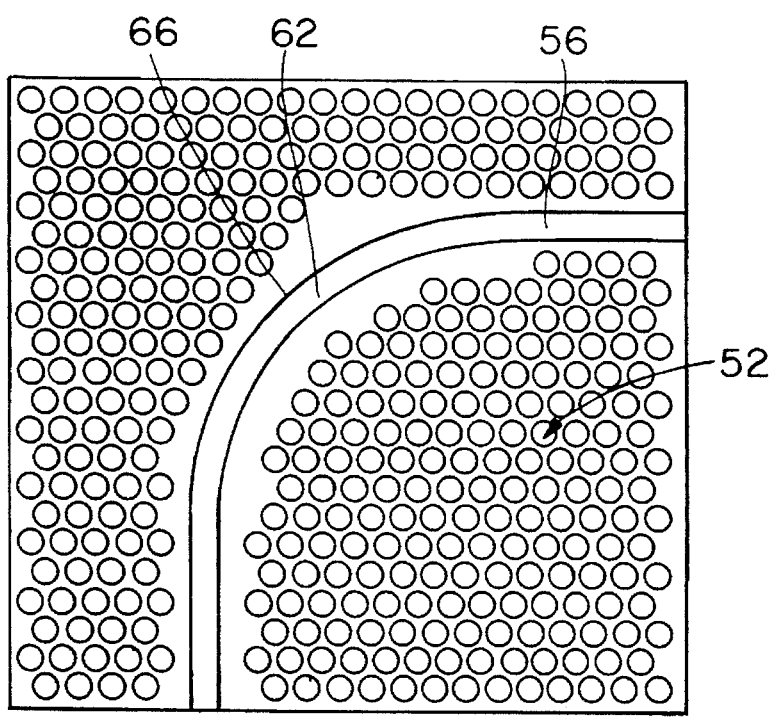
Figure 8A:
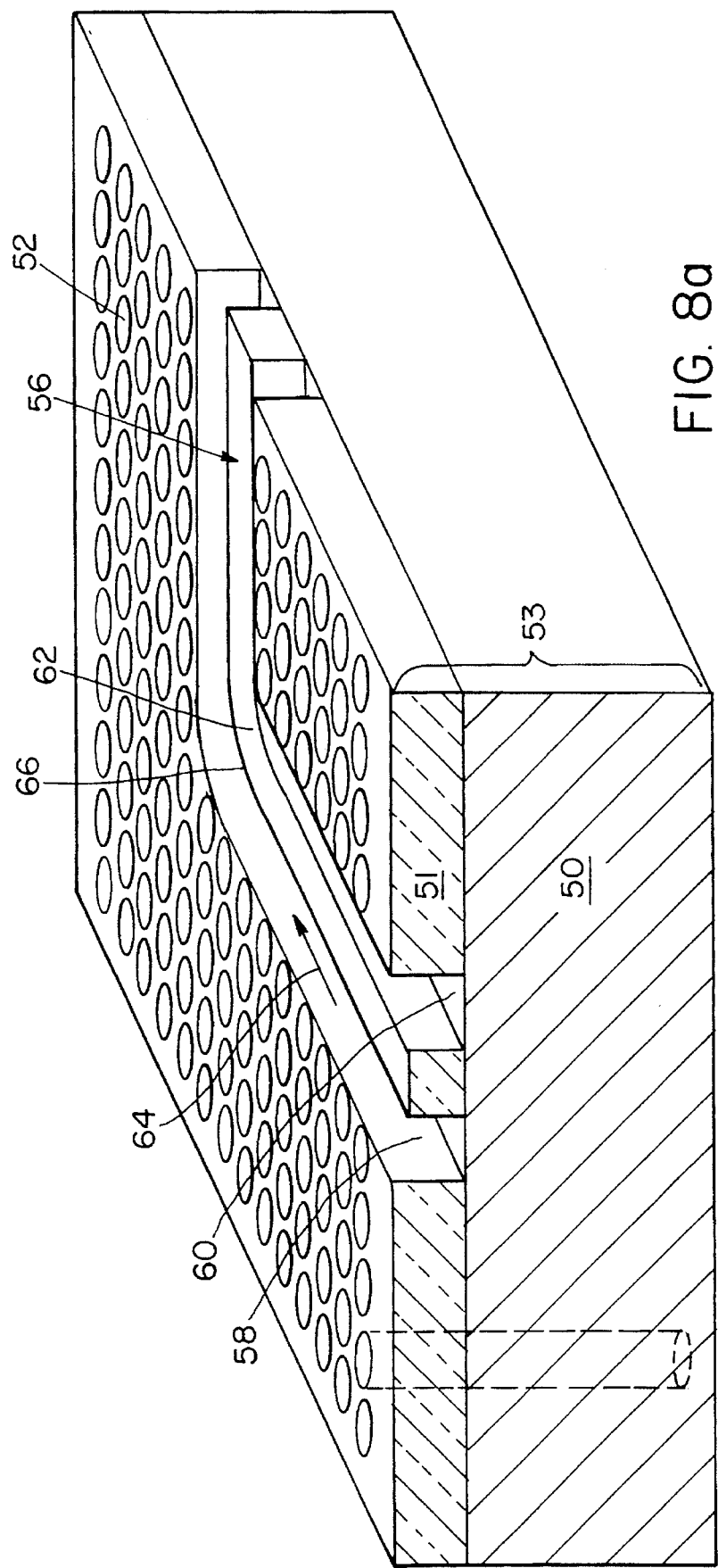
FIG. 8a is a schematic perspective view of a waveguide section on a substrate having a two-dimensional periodic dielectric structure in accordance with the present invention.

FIGS. 8a and 8b depict a section of waveguide 56 in accordance with another embodiment of the invention. A high-refractive-index epilayer 51 made of a material such as GaAs is formed on the top surface of a low-refractive-index base substrate 50 made of a material such as $Ga_xAl_{1-x}As$ to form a substrate 53. The substrate 53 may also be made of other materials such as dielectric or optical materials. The periodic dielectric structure 52 is periodic in two dimensions in the plane of the epilayer 51. The section of optical waveguide 56 is formed in the epilayer 51 between substantially parallel trenches 58 and 60. The waveguide section 56 includes a 90° circular bend 62. The 90° bend angle is chosen for illustration purposes only. The bend angle need not be 90°. The trenches 58 and 60 are formed by etching or other known processes. The air in the trenches provides refractive index contrast for internal reflection of the light carried by the waveguide 56. Periodic dielectric structure 52 is provided outside the trenches 58 and 60 to eliminate loss where the requirements for total internal reflection are not met.

The periodic dielectric structure 52 is formed as described in connection with FIGS. 4–6 to have a frequency band gap at the known frequency of the light propagating in the waveguide 56. Therefore, the light cannot propagate into the substrate 53 in the plane of the epilayer 51. As a result, loss of light at the bend 62 is virtually eliminated.

To illustrate, light travels through the waveguide 56 in the direction of arrow 64. As it enters the bend 62, it strikes the barrier 66 between the waveguide 56 and trench 58 at increasing angles as described previously. In prior devices having a uniform substrate, the light would propagate into the substrate and be lost. However, in the present invention as shown in FIGS. 8a and 8b, the light cannot propagate into the substrate 53 because of the periodic dielectric structure 52. Instead, the light is confined within the waveguide 56 and continues through the bend 62.

In the embodiment of FIGS. 8a and 8b, the waveguide 56 is formed by creating the trenches 58 and 60 in the epilayer 51. Other methods are also possible, including those previously described in connection with FIGS. 1a and 1b. A high-refractive-index channel may be formed by diffusing material into a uniform substrate or etching material onto the substrate. After the channel is formed, the periodic dielectric structure is formed in the substrate by the procedure previously described.

FIG. 9 illustrates a waveguide section 76 in accordance with another embodiment of the present invention. In this embodiment, the substrate 70 includes a high-refractive-index epilayer 71 and a lower-refractive-index base substrate 73. The substrate 70 also comprises a periodic dielectric structure 72 having three-dimensional spatial periodicity. Radiation is prevented from propagating in all three spatial dimensions of the substrate 70.

The three-dimensional periodic dielectric structure 72 is fabricated in a similar manner to the two-dimensional structure. The epilayer 71 is covered with a mask having a two-dimensional array of geometric figures defining the desired pattern for the top surface of the three-dimensional periodic dielectric structure. In one embodiment, the two-dimensional array has a triangular lattice pattern. The substrate and mask are exposed to the reactive-ion etchant. The etchant plasma is directed successively at three different angles with respect to the axis perpendicular to the top surface of the substrate. The angles are each oriented down 35.26° from the perpendicular and are separated by 120° from each other in azimuth. The resulting channels form a three-dimensional face-centered cubic lattice. The electromagnetic dispersion relation in this lattice will exhibit a photonic or frequency band gap.

With three-dimensional periodicity, the periodic dielectric structure 72 prevents propagation of light within the band gap in all three dimensions. Light cannot propagate laterally through the substrate 72 as in the two-dimensional case. But also, it cannot propagate toward the bottom surface 75 of the substrate 70. Optical losses are further reduced.

Figure 10:
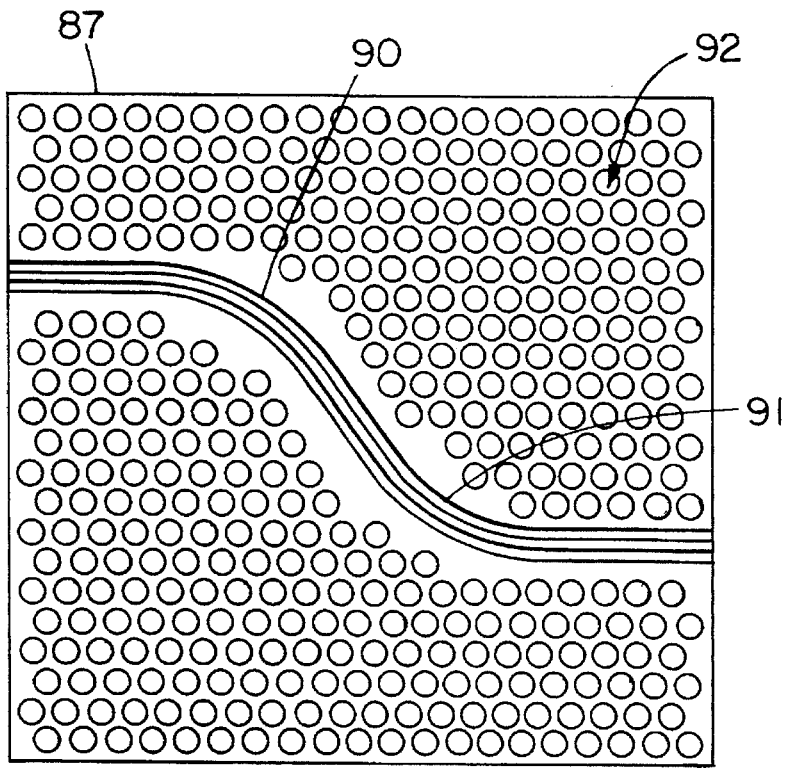
FIG. 10 is a schematic top view of an S-bend in accordance with the present invention.
Figure 11:
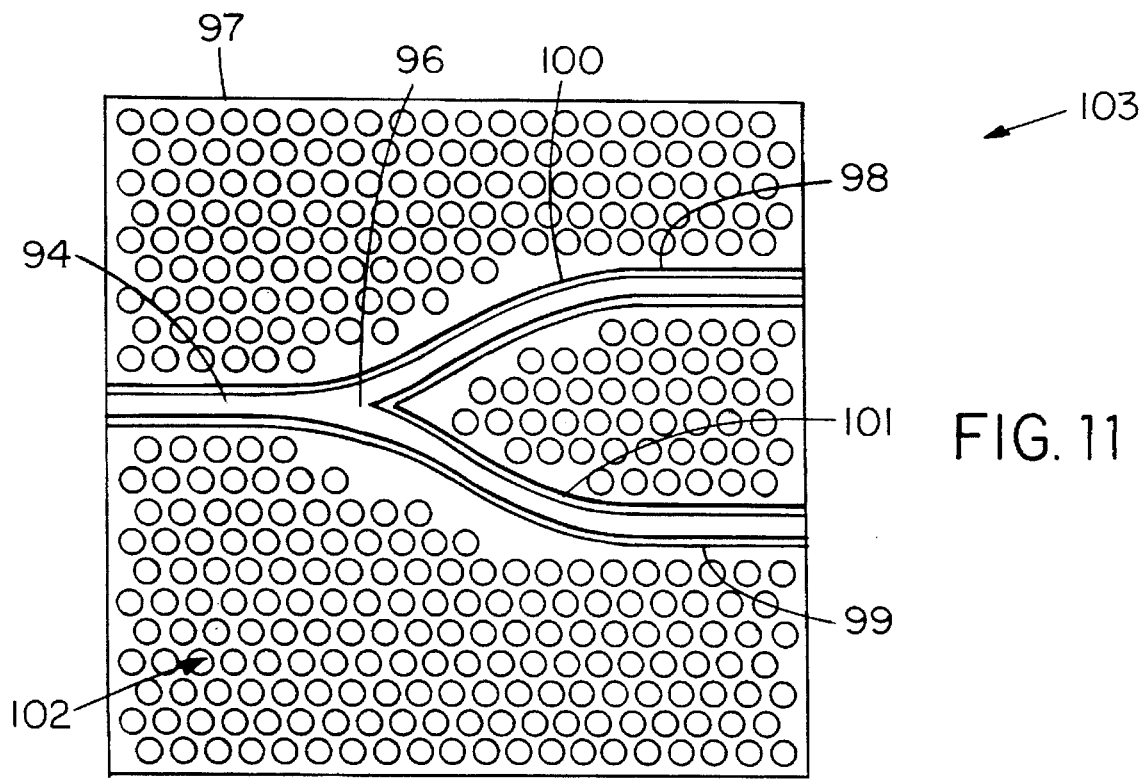
FIG. 11 is a schematic top view of a Y-coupler in accordance with the present invention.
Figure 12:
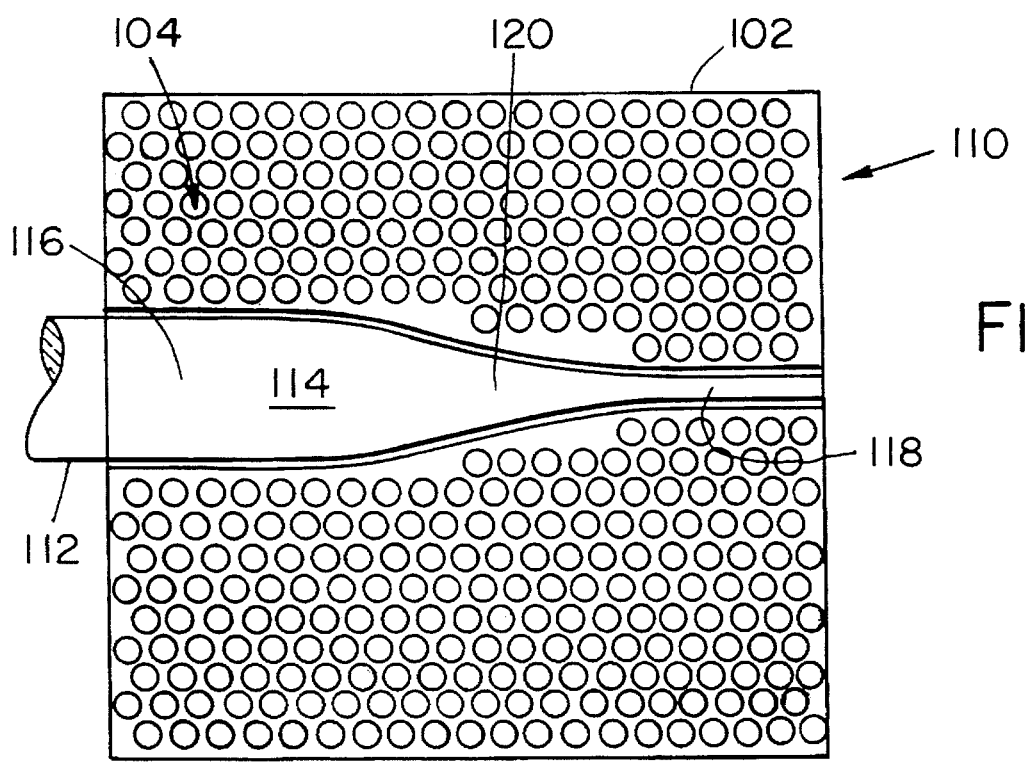
FIG. 12 is a schematic top view of a waveguide taper in accordance with the present invention.

FIGS. 10–12 illustrate various optical circuits to which the present invention is applicable. Each figure is a top view of a portion of a substrate on which is formed a device in accordance with the invention. The periodic dielectric structure used in each device may have either two-dimensional or three-dimensional periodicity.

FIG. 10 is a view of an S-bend device 93 in a waveguide section. The S-bend 93 is used in such devices as optical couplers. It includes two bend sections 90 and 91. In prior devices with uniform substrates, these bends would be sources of radiation loss. However, because the bends are surrounded by a periodic dielectric structure 92 in the substrate 87, the bend losses ae virtually eliminated.

FIG. 11 is a view of a Y-coupler device 103. An incoming signal enters the device 103 through straight section 94. The signal is split at junction 96 into two equal outgoing signals traveling through sections 98 and 99. Radiation losses associated with the junction 96 and bends 100 and 101 are virtually eliminated by the periodic dielectric structure 102 in the substrate 97. It should be noted that where radiation propagates from right to left in FIG. 11, the device 103 serves a combiner.

FIG. 12 shows a waveguide taper or funnel 110 on a substrate 102 with a periodic dielectric structure 104. Many applications require a fiber optic cable 112 to be permanently attached to a waveguide 114 on an optical integrated circuit. This connection can lead to insertion loss on the order of 10 dB. To reduce the loss, the cable end 116 of the integrated waveguide 114 is made the same width as the cable 112. The optimum width of the circuit end 118 of the waveguide 114 is less than the width of the cable end 116. The width transition between the two ends is made of a taper section 120. This taper section 120 is a source of loss which can be overcome by the periodic dielectric structure 104.

The present invention is not only applicable to optical systems. The periodic dielectric structure can be fabricated to have a frequency band gap anywhere in the microwave to ultraviolet bands ($10^6$ to $10^{15}$ Hz). Electromagnetic radiation at these frequencies can be prevented from propagating through a substrate. Therefore, the present invention is applicable to substantially confine radiation in waveguides, sources, detectors, lasers, power splitters, power combiners, tapers, interferometers, and any other device in which radiation needs to be confined. Losses can be substantially eliminated for electromagnetic radiation anywhere within the above frequency range.

While this invention has been particularly shown and described with references to preferred embodiments thereof, it will be understood by those skilled in the art that various changes in form and details may be made therein without departing from the spirit and scope of the invention as defined by the appended claims.

We claim:

1. A method of reducing radiation losses in optical integrated circuits, comprising:

providing a substrate;

forming the optical integrated circuit on or in the substrate; and forming a region of said substrate with a periodic dielectric lattice structure having a spatially periodic variation in dielectric constant in at least two dimensions in which the lattice dimensions are proportioned to produce a frequency band gap defining a band of frequencies of electromagnetic radiation at which the optical integrated circuit is operable such that radiation at such frequencies is substantially prevented from propagating in at least one dimension within the region.

2. The method of claim 1 wherein the periodic dielectric lattice structure is formed at least partially within the optical integrated circuit.

3. The method of claim 1 wherein the step of forming the optical integrated circuit comprises forming a laser.

4. The method of claim 1 wherein the step of forming the optical integrated circuit comprises forming a detector.

5. The method of claim 1 wherein the step of forming the optical integrated circuit comprises forming a filter.

6. The method of claim 1 wherein the step of forming the optical integrated circuit comprises forming a modulator.

7. The method of claim 1 wherein the step of forming the optical integrated circuit comprises forming a power divider.

8. The method of claim 1 wherein the step of forming the optical integrated circuit comprises forming a power combiner.

9. The method of claim 1 wherein the step of forming the optical integrated circuit comprises forming a switch.

10. The method of claim 1 wherein the periodic dielectric lattice structure is formed periodic in two dimensions.

11. The method of claim 1 wherein the periodic dielectric lattice structure is formed periodic in three dimensions.

12. The method of claim 1 wherein the step of providing a substrate comprises providing a semiconductor material.

13. The method of claim 1 wherein the step of forming a region comprises forming a periodic pattern of void regions in the substrate.

14. A method of reducing radiation losses associated with optical waveguides, comprising:

providing a substrate;

forming an optical waveguide on or in the substrate; and forming a region of said substrate with a periodic dielectric lattice structure having a spatially periodic variation in dielectric constant in at least two dimensions in which the lattice dimensions are proportioned to produce a frequency band gap defining a band of frequencies of electromagnetic radiation at which the optical waveguide is operable such that radiation at such frequencies is substantially prevented from propagating in at least one dimension within the region, said region being proximate to said waveguide.

15. The method of claim 14 wherein the waveguide is formed with a bend.

16. The method of claim 14 wherein the waveguide is formed with a taper.

17. The method of claim 14 wherein the periodic dielectric lattice structure is formed periodic in two dimensions.

18. The method of claim 14 wherein the periodic dielectric lattice structure is formed periodic in three dimensions.

19. The method of claim 14 wherein the step of providing a substrate comprises providing a semiconductor material.

20. The method of claim 14 wherein the step of forming a region comprises forming a periodic pattern of void regions in the substrate.

21. The method of claim 14 wherein the step of forming an optical waveguide comprises preventing the region with the periodic dielectric lattice structure from being formed in a specific portion of the substrate, said specific portion of the substrate being the optical waveguide.

22. The method of claim 14 wherein the step of forming an optical waveguide comprises diffusing a material into the substrate, said material having an index of refraction higher than the index of refraction of the substrate.

23. The method of claim 14 wherein the step of forming an optical waveguide comprises depositing a material onto a surface of the substrate, said material having a higher index of refraction than the index of refraction of the substrate.

24. The method of claim 14 wherein the step of forming an optical waveguide comprises forming two substantially parallel trenches in a surface of the substrate, said trenches defining a channel of material between them, said channel of material being the optical waveguide.

25. An optical circuit, comprising:

a substrate having a region with a periodic dielectric lattice structure having a spatially periodic variation in dielectric constant in at least two dimensions in which the lattice dimensions are proportioned to produce a frequency band gap defining a band of frequencies of electromagnetic radiation at which the optical circuit is operable such that radiation at such frequencies is substantially prevented from propagating in at least one dimension within the region; and at least one optical device formed on or in the substrate proximate to the region with the periodic dielectric lattice structure, such that radiation from the optical device having a frequency within the frequency band gap is substantially prevented from propagating within the substrate.

26. The optical circuit of claim 25 wherein the periodic dielectric lattice structure is formed at least partially within the optical device.

27. The optical circuit of claim 25 wherein the optical device is a laser.

28. The optical circuit of claim 25 wherein the optical device is a detector.

29. The optical circuit of claim 25 wherein the optical device is a filter.

30. The optical circuit of claim 25 wherein the optical device is a modulator.

31. The optical circuit of claim 25 wherein the optical device is a power divider.

32. The optical circuit of claim 25 wherein the optical device is a power combiner.

33. The optical circuit of claim 25 wherein the optical device is a switch.

34. The optical circuit of claim 25 wherein the periodic dielectric lattice structure is periodic in two dimensions.

35. The optical circuit of claim 25 wherein the periodic dielectric lattice structure is periodic in three dimensions.

36. The optical circuit of claim 25 wherein the substrate comprises a semiconductor material.

37. The optical circuit of claim 25 wherein the region with the frequency band gap comprises a periodic pattern of void regions in the substrate.

38. An optical circuit, comprising:

a substrate having a region with a periodic dielectric lattice structure having a spatially periodic variation in dielectric constant in at least two dimensions in which the lattice dimensions are proportioned to produce a frequency band gap defining a band of frequencies of electromagnetic radiation at which the optical circuit is operable such that radiation at such frequencies is substantially prevented from propagating in at least one dimension within the region; and at least one optical waveguide formed on or in the substrate proximate to the region with the periodic dielectric lattice structure, such that radiation in the waveguide at a frequency within the frequency band gap is substantially prevented from propagating into the substrate.

39. The optical circuit of claim 38 wherein the optical waveguide comprises a bend.

40. The optical circuit of claim 38 wherein the optical waveguide comprises a taper.

41. The optical circuit of claim 38 wherein the periodic dielectric lattice structure is periodic in two dimensions.

42. The optical circuit of claim 38 wherein the periodic dielectric lattice structure is periodic in three dimensions.

43. The optical circuit of claim 38 wherein the substrate comprises a semiconductor material.

44. The optical circuit of claim 38 wherein the region with the frequency band gap comprises a periodic pattern of void regions in the substrate.

45. The optical circuit of claim 38 wherein the optical waveguide is a channel in the substrate surrounded by the periodic dielectric lattice structure.

46. The optical circuit of claim 38 wherein the optical waveguide is a channel of material diffused into the substrate, said material having an index of refraction which is higher than the index of refraction of the substrate.

47. The optical circuit of claim 38 wherein the optical waveguide is a channel of material deposited on a surface of the substrate, said material having an index of refraction which is higher than the index of refraction of the substrate.

48. The optical circuit of claim 38 wherein the optical waveguide is a channel of material between two substantially parallel trenches in a surface of the substrate.

49. The method of claim 1 wherein the region with the periodic dielectric lattice structure is formed proximate to the optical integrated circuit.

50. The method of claim 1 wherein the region with the periodic dielectric lattice structure is formed within the optical integrated circuit.

51. The optical circuit of claim 25 wherein the region with the periodic dielectric lattice structure is proximate to the optical device.

52. The optical circuit of claim 25 wherein the region with the periodic dielectric lattice structure is within the optical device.

53. The method of claim 1 wherein the step of forming a region comprises forming a periodic pattern of holes in the substrate to form a periodic pattern of elements of a dielectric constant different from the dielectric constant of the substrate.

54. The method of claim 53 wherein the periodic pattern of elements formed is periodic in two dimensions.

55. The method of claim 53 wherein the periodic pattern of elements formed is periodic in three dimensions.

56. The method of claim 53 wherein the step of forming a periodic pattern of holes comprises drilling.

57. The method of claim 53 wherein the step of forming a periodic pattern of holes comprises reactive ion etching.

58. The method of claim 14 wherein the step of forming a region comprises forming a periodic pattern of holes in the substrate to form a periodic pattern of elements of a dielectric constant different from the dielectric constant of the substrate.

59. The method of claim 58 wherein the periodic pattern of elements formed is periodic in two dimensions.

60. The method of claim 58 wherein the periodic pattern of elements formed is periodic in three dimensions.

61. The method of claim 58 wherein the step of forming a periodic pattern of holes comprises drilling.

62. The method of claim 58 wherein the step of forming a periodic pattern of holes comprises reactive ion etching.

* * * * *